United States Patent [19]

Samuels

[11] Patent Number: 5,027,145
[45] Date of Patent: Jun. 25, 1991

[54] HEAT EXCHANGER FOR FILM PROCESSOR

[75] Inventor: James T. Samuels, Rochester, N.Y.

[73] Assignee: Eastman Kodak Company, Rochester, N.Y.

[21] Appl. No.: 574,842

[22] Filed: Aug. 29, 1990

[51] Int. Cl.$^5$ ............................ G03D 3/02; G03D 3/08
[52] U.S. Cl. .................................. 354/299; 354/322; 354/324
[58] Field of Search ............... 354/299, 320, 321, 322, 354/324

[56] References Cited

U.S. PATENT DOCUMENTS

| | | | |
|---|---|---|---|
| 3,832,730 | 8/1974 | Geyken et al. | 354/299 |
| 3,922,701 | 11/1975 | Geyken et al. | 354/299 |
| 3,983,934 | 10/1976 | Lee | 354/299 |
| 4,316,663 | 2/1982 | Fischer | 354/299 |
| 4,350,429 | 9/1982 | Slavin | 354/299 |
| 4,420,940 | 12/1983 | Buffet | 62/3 |

OTHER PUBLICATIONS

Midland Ross Product Brochure (published prior to 1990).

Primary Examiner—A. A. Mathews
Attorney, Agent, or Firm—Dana M. Schmidt

[57] ABSTRACT

There is described a film processor wherein an improved heat exchanger is provided for the liquid chemicals of two of its baths. The method of heat exchanging is also described. Specifically, the heat exchanger is a thermoelectric Peltier device that cools the developer at its heat sink and heats the wash water at its heat-emitting source.

5 Claims, 3 Drawing Sheets

HEAT EXCHANGER FOR FILM PROCESSOR

FIELD OF THE INVENTION

This invention relates to the thermal controls of a film processor, particularly those controlling the temperature of the developer and the wash water.

BACKGROUND OF THE INVENTION

Film processors, for example, those used to develop exposed X-ray films, conventionally process exposed photographic or X-ray film through at least two, and typically three, liquid chemical baths, and then through a dryer. The baths comprise at least a developer bath and a water wash bath, and if three baths are present, a fixer bath in between. The temperature of these baths is important and conventionally is controlled by heaters and heat exchangers.

More specifically, conventionally the temperature of the developer has been raised to its desired point, e.g., about 35° C., by the use of a heater. However, the temperature of the developer frequently rises above this temperature. If left alone, the developer will heat up beyond its optimum temperature, and a heat exchanger is used to cool this hot developer liquid. Because the wash water of the last bath is optimally heated to at least about 4° C., for optimum washing capability, it has been known to use the wash water as the heat sink in the heat exchanger.

Such wash water has been effective in driving the heat exchanger for the developer, but only when the source of the wash water, e.g., from the tap, is already at least 5° C. less than the desired temperature of the developer leaving the heat exchanger. In some instances, for example, certain developing countries, such is not always the case. In such events, the water is unable to cool the developer sufficiently and the heat exchanger fails. The alternative of mounting a separate cooling unit on the source of wash water has been cumbersome and uneconomical.

SUMMARY OF THE INVENTION

I have constructed a film processor which solves the above-mentioned problems. It does so based upon the recognition that the desired heat transfer must be achieved by a mechanism that is independent of the wash water temperature, rather than being driven by the wash water temperature.

More specifically, in accord with one aspect of the invention, there is provided a film processor for developing photographic film by moving it through chemicals, the processor including at least two liquid chemical baths wherein one bath contains a developer liquid and the other a wash water liquid, means for advancing film through the baths, and means for controlling the temperature of the liquid of the baths, the controlling means comprising means defining a flow path for the liquid chemical of each bath and a heat exchanger positioned adjacent to the flow paths to at least remove heat from the developer liquid. The processor is improved in that the heat exchanger comprises a thermoelectric Peltier heat transfer device having a heat sink and a heat-emitting source, the heat sink being thermally connected to the flow-path defining means of the developer liquid and the heat-emitting source being thermally connected to the flow-path defining means of the wash water liquid, so that the developer liquid can be cooled and the wash water liquid can be heated regardless of the relative temperature of each of the liquids as it enters the heat exchanger.

In accord with another aspect of the invention, there is provided a method of cooling a hot developer liquid in a film processor while simultaneously heating in a single heat exchanger a wash water liquid used in the processor. The method comprises the steps of (a) passing the hot developer liquid through a thermoelectric Peltier heat exchanger at the heat sink side of the thermoelectric heat exchanger, and (b) simultaneously passing the wash water liquid through the thermoelectric heat exchanger at the heat-emitting side thereof, so that the wash water liquid does not have to cool the developer liquid.

Accordingly, it is an advantageous feature of the processor of this invention that the developer can be kept cooled to its optimum temperature regardless of how hot the wash water is at its source, and without pre-cooling the wash water.

It is a related advantageous feature of the processor and method of this invention that the desired temperature of both the developer and the wash water can be achieved without necessitating separate heat exchangers for each of the two liquids.

Other advantageous features will become apparent upon reference to the following Description of the Preferred embodiments, when read in light of the attached drawings.

DESCRIPTION OF THE PREFERRED EMBODIMENTS

The invention is hereinafter discussed in connection with the preferred embodiments, in which a film processor of a particular construction is described, using a thermoelectric Peltier heat exchanger of preferred construction to process X-ray film. In addition, the invention is useful in a film processor of any construction wherein the Peltier heat exchanger has any construction, regardless of whether the film being developed is X-ray or some other type.

Figure 1:
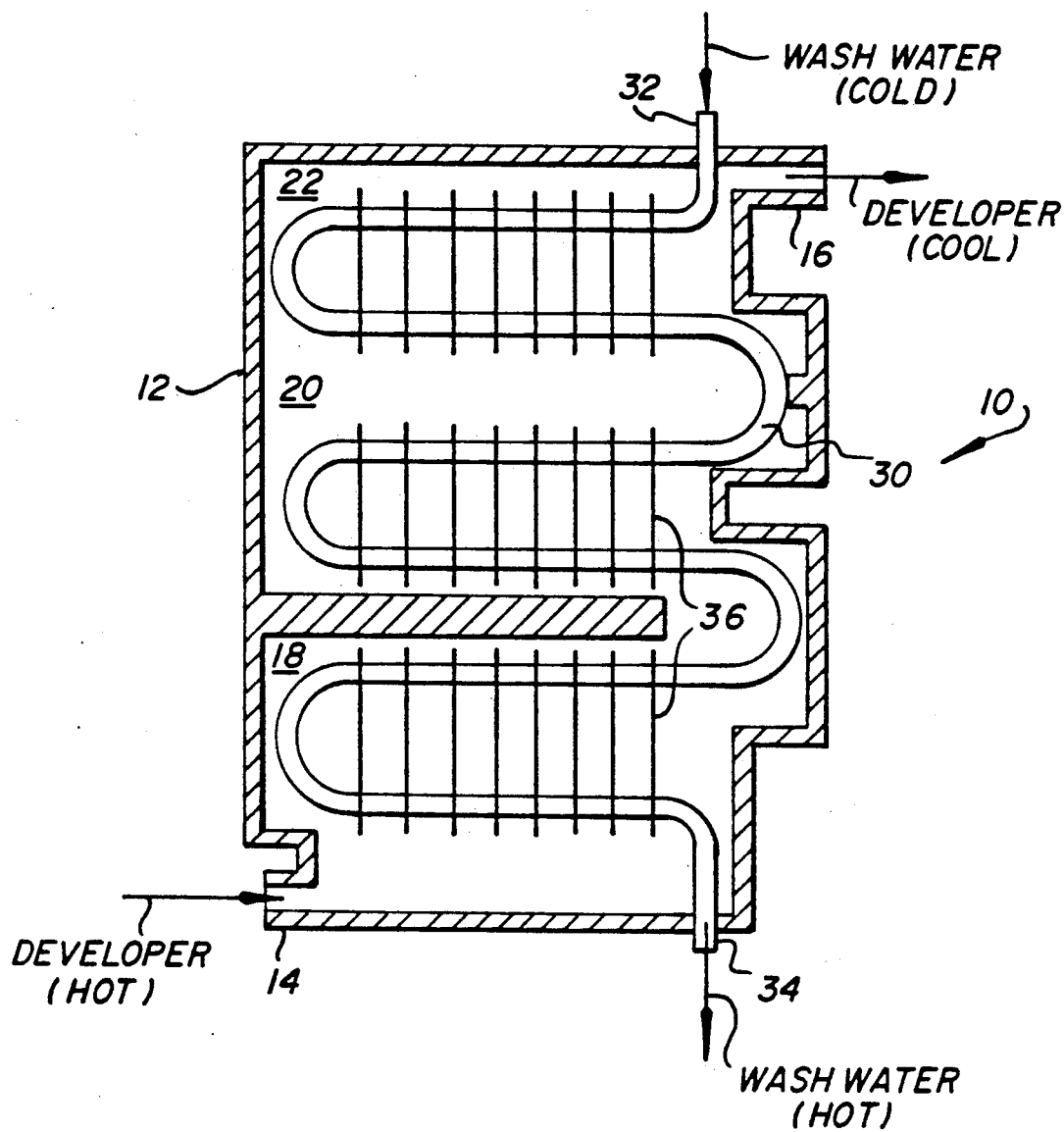
FIG. 1 is a partially schematic view in section illustrative of heat exchangers used in the prior art.

As noted above, it has been conventional, FIG. 1, to use the wash water as the driving mechanism for a heat-exchanger 10 in a film processor. In the exchanger of FIG. 1, the flow of the two liquids is shown as being counter-current, but co-current flow is also useful. Thus, heat-exchanger 10 comprises a housing 12 having an entrance port 14 at the bottom for the hot developer, and an exit port 16 at the top. Housing 12 is loosely divided into three stacked sections 18, 20 and 22 through which the developer flows upwardly to get to exit port 16. Winding through sections 18, 20 and 22 is a serpentine pipe 30, having on inlet end 32 and an outlet end 34, such pipe carrying the wash water provided from a source (not shown) such as a tap. Both exit port 16 and outlet end 34 feed their respective liquids to the rest of the processor, FIG. 2. Entrance port 14 necessarily draws the developer in from the developer bath of the processor. Fins 36 can be optionally provided on pipe 30 to further enhance the heat exchange.

As will be readily apparent, such an exchanger 10 works fine as long as the wash water entering end 32 is sufficiently cool (<5° C.) than the temperature of the developer leaving port 16. This however cannot be guaranteed in all possible environments.

Figure 2:
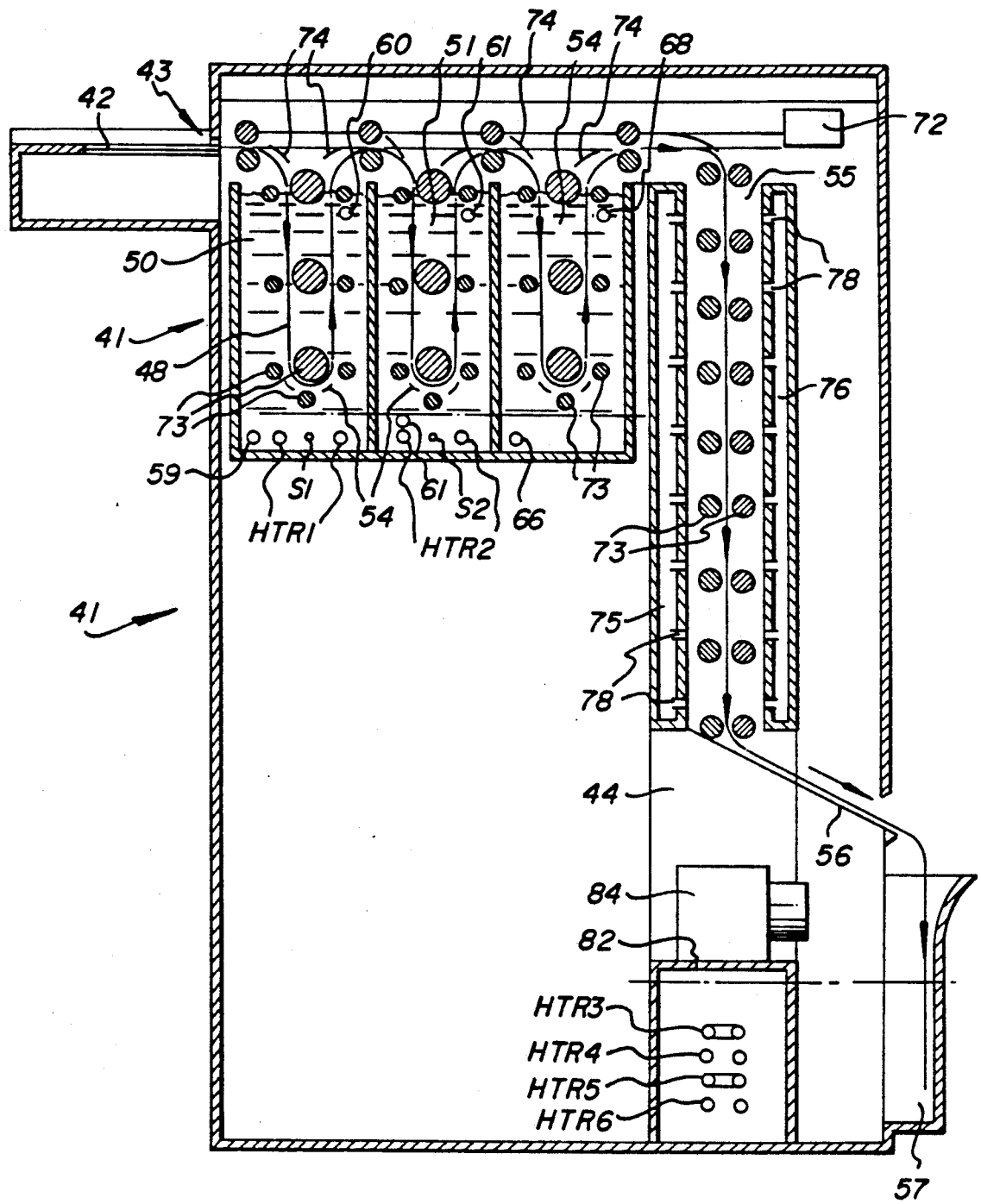
FIG. 2 is an elevational view in section of a representative film processor constructed in accordance with the invention.

FIG. 2 is illustrative of film processors that can use heat exchangers to control the temperature of the developer and of the wash water. For example, it comprises a shelf 42 upon which the operator places an exposed negative of X-ray film. The film then enters the processor 41 through the opening 43. The course of the film through the processor 41 appears as the line 48. After the film enters the opening 43, it first goes into the tank 50 which contains conventional developer liquid. The developer tank 50, at its bottom, includes a heater HTR1 to warm it to its proper operating temperature. The sensor S1 provides an indication of the actual temperature within the developer tank 50.

The film then preferably passes into the fixer tank 51 which has its heater HTR2 and sensor S2. The film then travels into the tank of wash water 54 which washes the film, after which is passes into the dryer section 55. After passing through the dryer 55, the film then slides along the shelf 56 into the film bin 57.

Although not shown, the developer tank 50 can have a standpipe drain which maintains the proper level of liquid. Tank 50 also has the two openings 59,60 to permit the circulation of liquid through the developer tank 50 from the heat exchanger. The fixer tank 51 also has an overflow standpipe and the circulation openings 61. The water tank 54 has openings 66,68 for incoming and outgoing water.

To move the film through the processor, rollers 73 are provided along with conventional drive motor 72. Guides 74 are conventionally provided to deflect the film to follow desired path 48.

In dryer section 55, openings 78 are provided in plenums 75 and 76 to deliver air from compartment 82 where it is heated by heaters HTD 3, 4, 5 and 6. Fan 84 is used to pump the air from compartment 82 to plenums 75 and 76.

Figure 3:
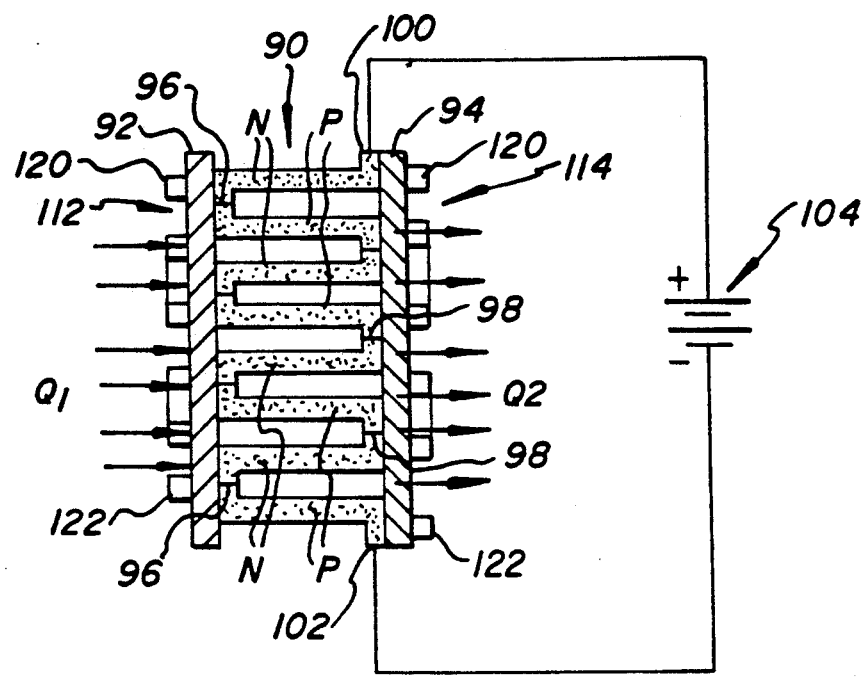
FIG. 3 is a partially schematic elevational view of the heat exchanger of this invention, taken along the line III—III of FIG. 4.

In accordance with the invention, the heat exchanger of processor 41 comprises a conventional thermoelectric Peltier heat transfer device 90, FIG. 3, sandwiched between two thermally conductive plates 92 and 94. As is conventional, device 90 comprises a plurality of P-N semiconductor devices serially connected so that the junctions 96 and 98 of the connections fall, in the case of junctions N-P 96, on the left side in contact with plate 92, and in the case of P-N junctions 98, on the right side in contact with plate 94. By connecting ends 100 and 102 of device 90 with a DC source 104, device 90 conventionally makes plate 92 a heat sink, arrows Q1, and plate 94 a heat-emitting source, arrows Q2. Plates 92 and 94 are formed of thermally conductive material, e.g., aluminum.

Figure 4:
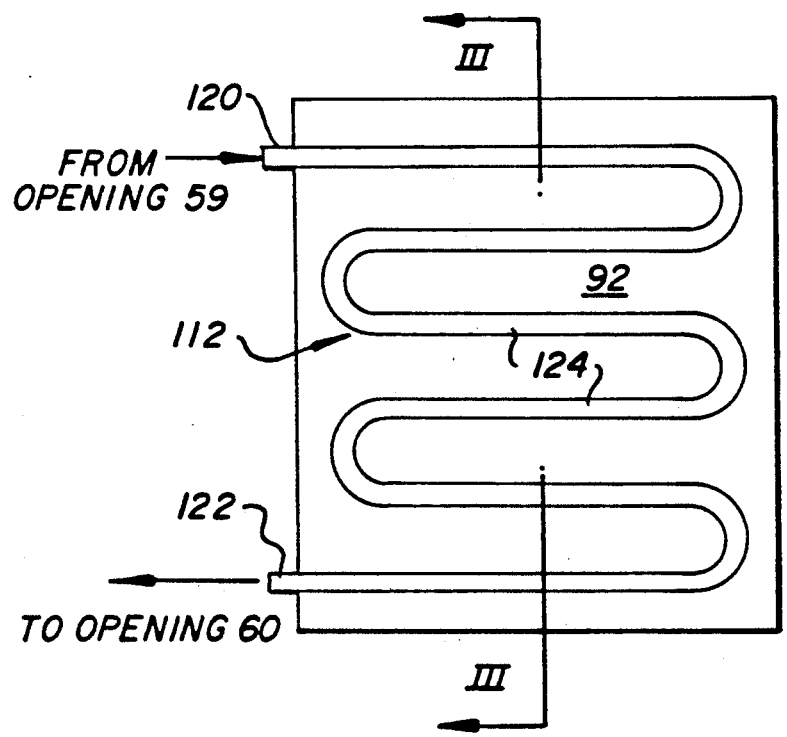
FIG. 4 is a side elevational view of one of the exterior side faces of the heat exchanger of FIG. 3.

Mounted in intimate contact with each of plates 92 and 94 is a serpentine coil of pipe 112 and 114, respectively. Such contact can be achieved, e.g., by welding. As shown in FIG. 4 which is representative of both pipes 112 and 114, each pipe (here, pipe 112) has an inlet end 120 and an outlet end 122, with any number of coils 124 between them. Pipe 112 contains the flow of the developer liquid from tank 50, whereas pipe 114 contains the flow of the wash water from tank 54. Thus, inlet 120 of pipe 112 collects heated developer liquid from e.g., opening 59 of tank 50 and outlet 122 delivers cooled developer to opening 60. For pipe 114, inlet 120 receives wash water from a tap source, regardless of its temperature, and outlet 122 of pipe 114 delivers heated wash water to either opening 66 or 68. The other of openings 66,68 is used for drawing off excess water. Alternatively, a standpipe can be used to remove the excess water.

In this fashion, heat exchanger 90 is effective to cool the developer liquid in pipe 112 while heating wash water in pipe 114, regardless of the temperature of the water as it enters inlet 120 of pipe 114. That is, the wash water is not the heat sink for the developer liquid.

The invention has been described in detail with particular reference to preferred embodiments thereof, but it will be understood that variations and modifications can be effected within the spirit and scope of the invention.

What is claimed is:

1. In a film processor for developing photographic film by moving it through chemicals, said processor including at least two liquid chemical baths wherein one bath contains a developer liquid and the other a wash water liquid, means for advancing film through said baths, and means for controlling the temperature of the liquid of said baths, said controlling means comprising means defining a flow path for the liquid chemical of each bath and a heat exchanger positioned adjacent to said flow paths to at least remove heat from said developer liquid;

the improvement wherein said heat exchanger comprises a thermoelectric Peltier heat transfer device having a heat sink and a heat-emitting source, said heat sink being thermally connected to said flow-path defining means of the developer liquid and said heat-emitting source being thermally connected to said flow-path defining means of said wash water liquid, so that said developer liquid can be cooled and said wash water liquid can be heated regardless of the relative temperature of each said liquid as it enters said heat exchanger.

2. A processor as defined in claim 1, wherein said heat sink and said heat-emitting source of said heat transfer device are each thermally connected through a sheet of aluminum to said respective flow-defining means.

3. A processor as defined in claim 2, wherein said means defining a flow path comprise piping which is bent into a serpentine path for passing the liquid chemical of each of said baths in contact with said heat exchanger.

4. A processor as defined in claim 1, wherein said means defining a flow path comprise piping which is bent into a serpentine path for passing the liquid chemical of each of said baths in contact with said heat exchanger.

5. A method of cooling a hot developer liquid in a film processor while simultaneously heating in a single heat exchanger a wash water liquid used in said processor, the method comprising the steps of (a) passing the hot developer liquid through a thermoelectric Peltier heat exchanger at the heat sink side of said thermoelectric heat exchanger, and (b) a simultaneously passing the wash water liquid through said thermoelectric heat exchanger at the heat-emitting side thereof, so that the wash water liquid does not have to cool the developer liquid.

* * * * *

UNITED STATES PATENT AND TRADEMARK OFFICE
CERTIFICATE OF CORRECTION

PATENT NO. : 5,027,145

DATED : June 25, 1991

INVENTOR(S) : James T. Samuels

It is certified that error appears in the above-identified patent and that said Letters Patent is hereby corrected as shown below:

Col. 4, line 63, the part reading:

"(b) a simultaneously passing", should read:

--(b) simultaneously passing--.

Signed and Sealed this

Twenty-second Day of December, 1992

Attest:

DOUGLAS B. COMER

*Attesting Officer*      *Acting Commissioner of Patents and Trademarks*